(12) United States Patent  
Hirota

(10) Patent No.: US 8,999,827 B2
(45) Date of Patent: Apr. 7, 2015

(54) SEMICONDUCTOR DEVICE MANUFACTURING METHOD

(75) Inventor: Toshiyuki Hirota, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 503 days.

(21) Appl. No.: 13/217,473

(22) Filed: Aug. 25, 2011

(65) Prior Publication Data

US 2012/0058637 A1 Mar. 8, 2012

(30) Foreign Application Priority Data

Sep. 2, 2010 (JP) ................. 2010-196690

(51) Int. Cl.
| H01L 21/3205 | (2006.01) |
| H01L 21/4763 | (2006.01) |
| H01L 21/44 | (2006.01) |
| H01L 27/24 | (2006.01) |
| H01L 21/768 | (2006.01) |
| H01L 27/108 | (2006.01) |

(52) U.S. Cl.
CPC ...... *H01L 27/2463* (2013.01); *H01L 21/76834* (2013.01); *H01L 21/76897* (2013.01); *H01L 27/10814* (2013.01); *H01L 27/10855* (2013.01); *H01L 27/10876* (2013.01); *H01L 27/10885* (2013.01); *H01L 27/10888* (2013.01)

(58) Field of Classification Search
USPC ................... 257/E21.579, E21.585
See application file for complete search history.

(56) References Cited

U.S. PATENT DOCUMENTS

| 8,158,509 B2 * | 4/2012 | Omura et al. ................. 438/622 |
| 2002/0019123 A1 * | 2/2002 | Ma et al. ........................ 438/622 |
| 2006/0094234 A1 * | 5/2006 | Soda et al. ..................... 438/638 |
| 2011/0147937 A1 * | 6/2011 | Kubota .......................... 257/751 |

FOREIGN PATENT DOCUMENTS

| JP | 2000-091340 | 3/2000 |
| JP | 2000-100943 | 4/2000 |
| JP | 2002009149 | 1/2002 |
| JP | 2002-319551 | 10/2002 |

* cited by examiner

Primary Examiner — Mohsen Ahmadi
(74) Attorney, Agent, or Firm — Young & Thompson

(57) ABSTRACT

A method of manufacturing a semiconductor device, includes: forming a first and second interconnect trenches adjacent to each other in an interlayer insulating film; providing a first interconnect and a space thereon within the first interconnect trench, and a second interconnect and a space thereon within the second interconnect trench; forming a first trench larger in width from the first interconnect trench and a second trench larger in width from the second interconnect trench, by conducting isotropic-etching; and forming a first insulating film within the first trench and a second insulating film within the second trench by filling an insulating material in the first trench and the second trench.

20 Claims, 18 Drawing Sheets

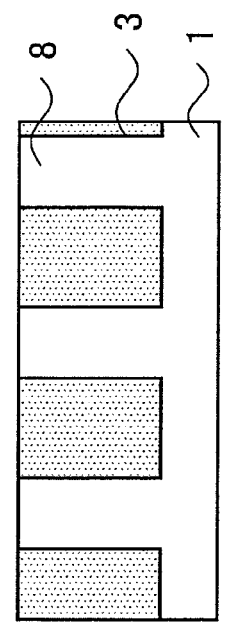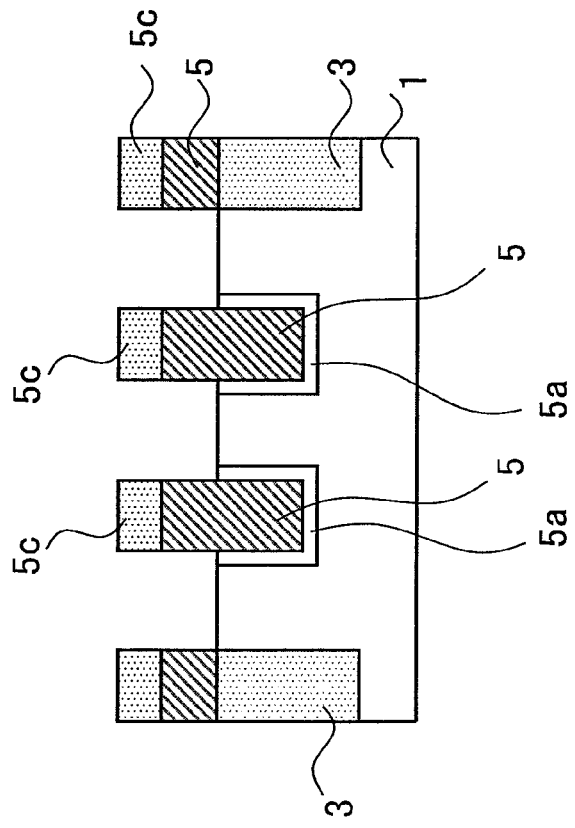

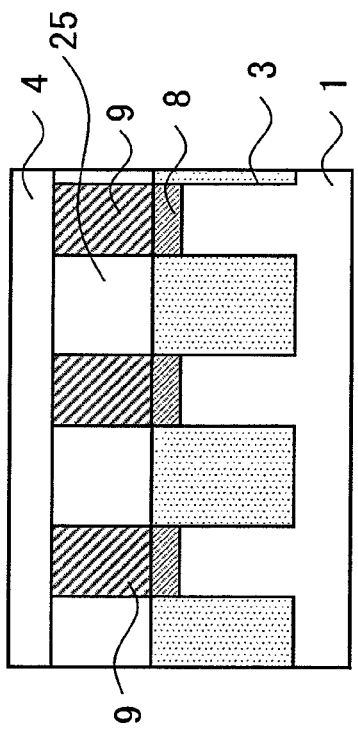
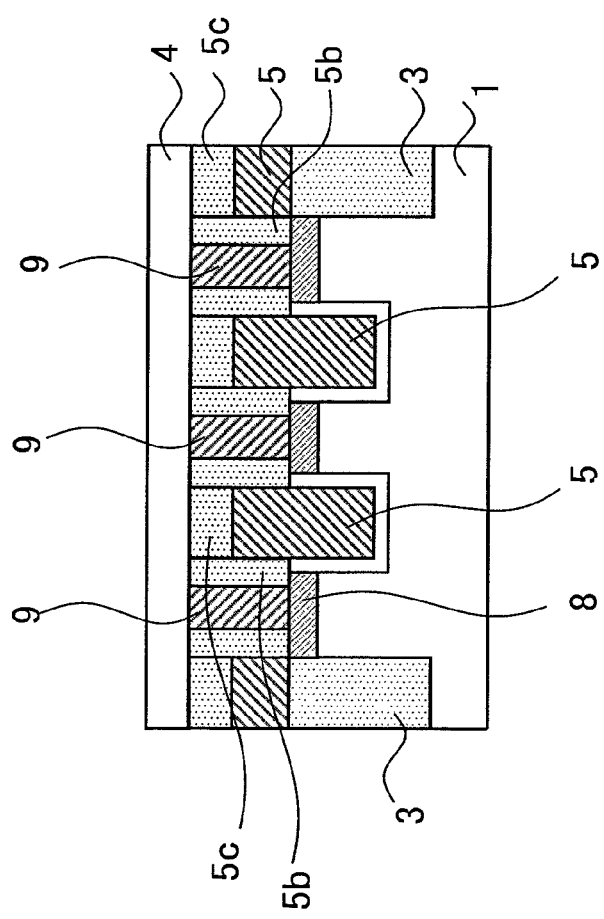

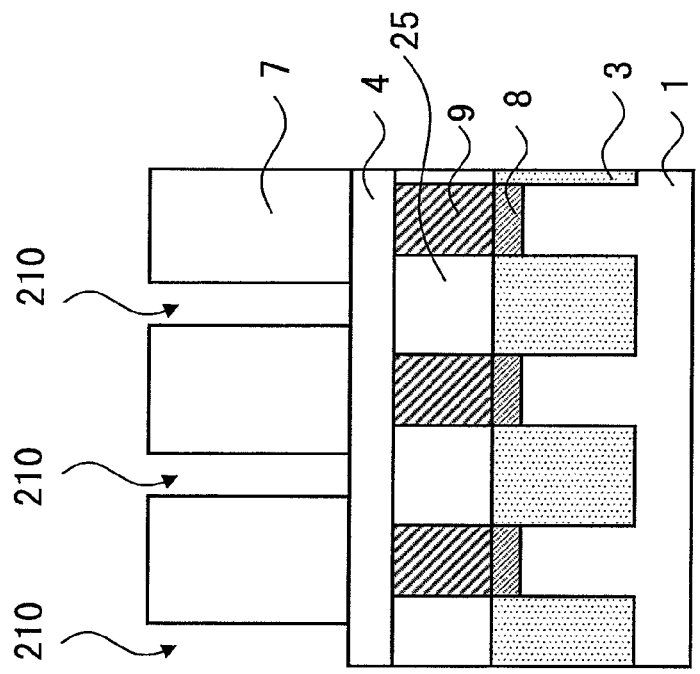
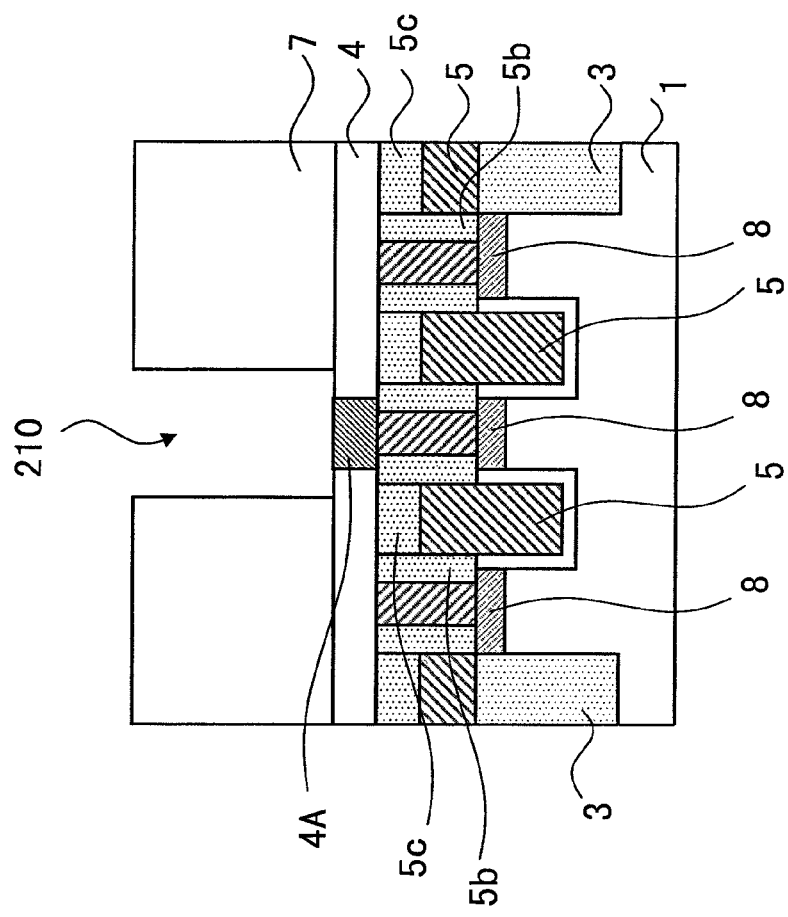
FIG. 7A
FIG. 7B

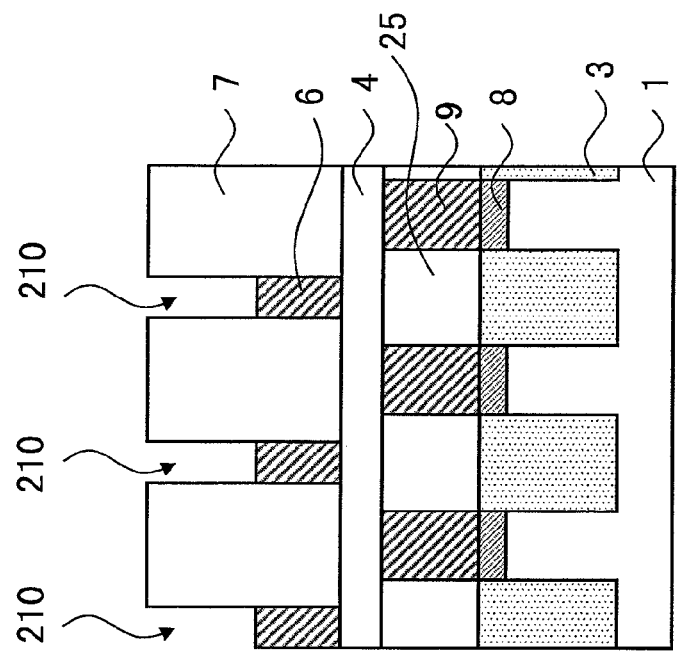
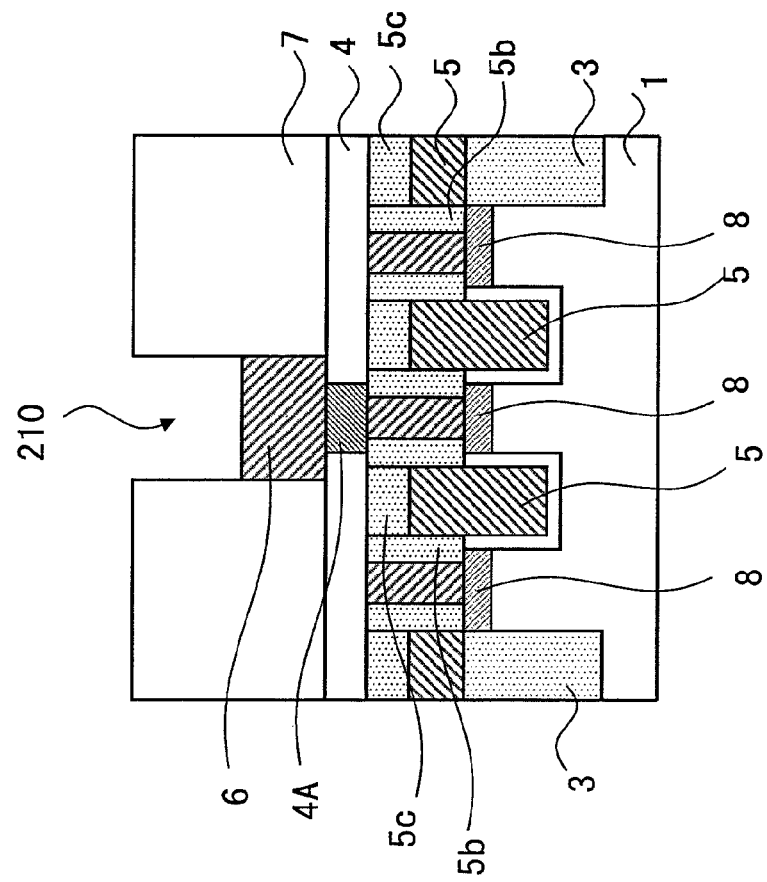

SEMICONDUCTOR DEVICE MANUFACTURING METHOD

BACKGROUND OF THE INVENTION

1. Field of the Invention

The present invention relates to a method of manufacturing a semiconductor device.

2. Description of Related Art

Along with progress in the miniaturization of semiconductor devices, the width of an interconnect for connecting between elements has also been reduced. If the electrical resistance of the interconnect increases due to a reduction in the width thereof, it is difficult to perform predetermined circuit operation. Although a rise in interconnect resistance can be suppressed by increasing the thickness of a conductive film used as the interconnect, in that case, such problems as described below are involved:

In order to precisely process miniaturized interconnects, etching using a hard mask is practiced in general. As the thickness of a conductive film for interconnects is increased, a hard mask also needs to be thick-filmed, in order to ensure resistance to etching. Accordingly, it has become difficult to precisely process the hard mask itself. In addition, an increase in the post-etching aspect ratio of interconnects, including hard mask portions provided thereon, has led to the occurrence of a phenomenon that an interconnect layer collapses during a manufacturing process. This has been a cause for a decline in production yields.

As a method of processing a thick-filmed interconnect layer without using a hard mask, there is known a damascene method in which trenches corresponding to an interconnect pattern are formed in an interlayer insulating film, and a conductive film is filled in the trenches. For example, JP2000-091340A describes a method of forming damascene interconnects in an interlayer insulating film on a semiconductor substrate by performing chemical-mechanical polishing using a polishing stopper film.

On the other hand, there is known a self-alignment method (SAC method) as a technique to densely dispose interconnects. According to the self-alignment method, it is possible to easily form a hole adjacent to an interconnect by covering upper and side surfaces of the interconnect with an etching protection insulating film and performing dry etching for the purpose of forming holes for plugs in an interlayer insulating film, as described in, for example, JP2002-319551A.

SUMMARY

With a damascene method, it is possible to fix problems in interconnect formation by the above-described etching. However, if a contact plug is disposed between interconnects formed by the damascene method, the periphery of each interconnect is covered with an interlayer insulating film at the time damascene interconnects are formed. Accordingly, there has been the problem that the self-alignment method cannot be used. Thus, from the viewpoint of short-circuit prevention, there has been the need to provide an adequate space between the interconnect and the contact plug. Consequently, in a case where a plurality of interconnects and a plurality of contact plugs are precisely disposed as in, for example, a memory cell, an area occupied by the interconnects increases. Thus, high-density integration becomes difficult to achieve.

As described above, it is difficult to simultaneously achieve both forming a high-aspect ratio interconnect with an excellent yield in order to suppress a rise in interconnect resistance due to miniaturization, and disposing the interconnect and a contact plug close to each other for high densification.

In one exemplary embodiment, there is provided a method of manufacturing a semiconductor device, including:

forming a first interconnect trench and a second interconnect trench adjacent to the first interconnect trench in an interlayer insulating film;

providing a first interconnect and a space on the first interconnect within the first interconnect trench, and a second interconnect and a space on the second interconnect within the second interconnect trench;

forming a first trench resulting from the first interconnect trench being increased in width and a second trench resulting from the second interconnect trench being increased in width, by carrying out isotropic etching;

forming a first insulating film within the first trench and a second insulating film within the second trench by filling an insulating material in the first trench and the second trench.

According to an exemplary embodiment, it is possible to provide a semiconductor device manufacturing method capable of forming fine interconnects with a high aspect ratio and a high density.

BRIEF DESCRIPTION OF THE DRAWINGS

The above features and advantages of the present invention will be more apparent from the following description of certain preferred exemplary embodiments taken in conjunction with the accompanying drawings, in which:

FIGS. 4A and 4B are cross-sectional views for explaining a step following the step of forming the structure illustrated in FIGS. 3A and 3B;

FIGS. 6A and 6B are cross-sectional views for explaining a step following the step of forming the structure illustrated in FIGS. 5A and 5B;

FIGS. 7A and 7B are cross-sectional views for explaining a step following the step of forming the structure illustrated in FIGS. 6A and 6B;

FIGS. 8A and 8B are cross-sectional views for explaining a step following the step of forming the structure illustrated in FIGS. 7A and 7B;

DETAILED DESCRIPTION OF PREFERRED EMBODIMENTS

Figure 1:
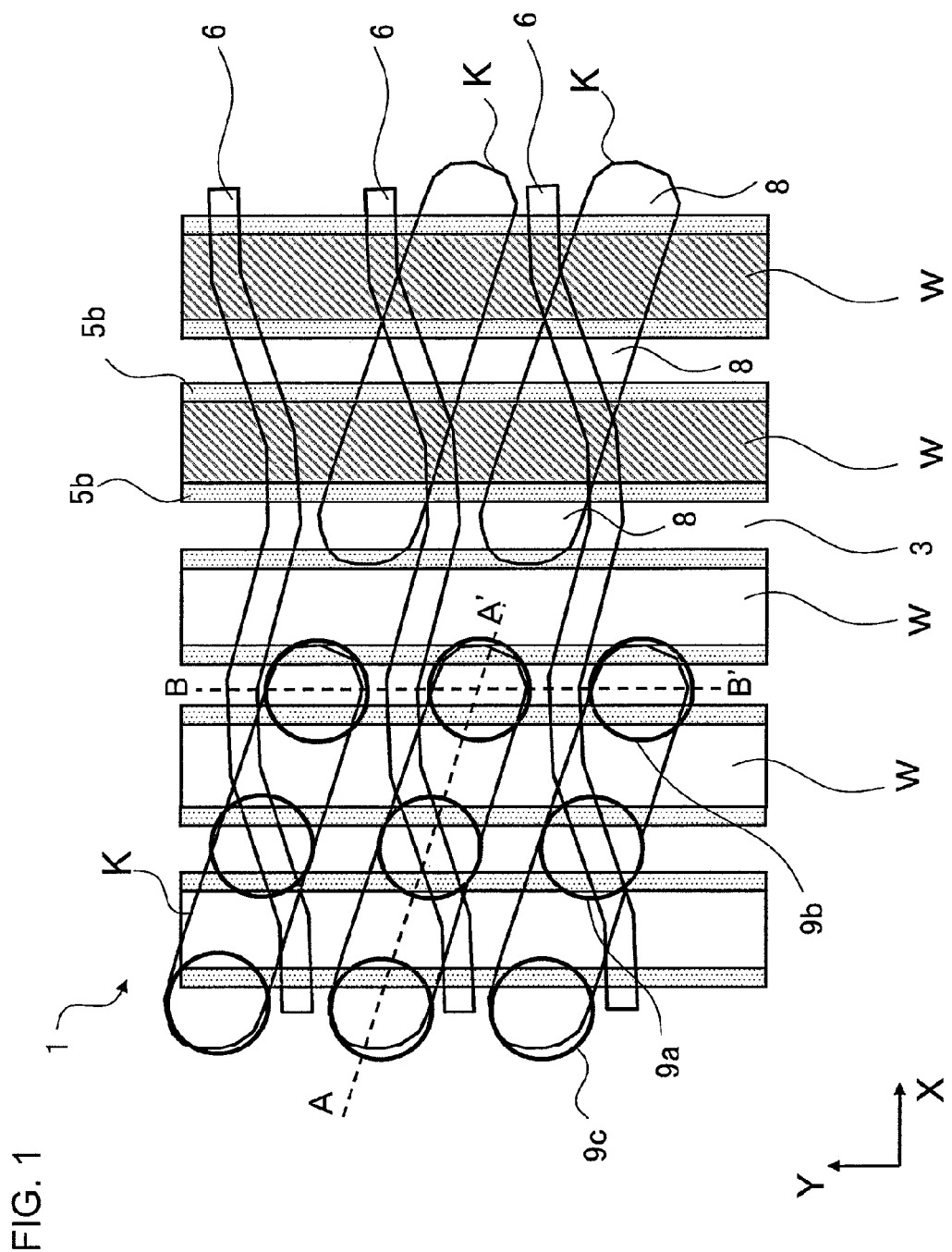
FIG. 1 is a plan view illustrating the structure of a memory cell section of a DRAM (dynamic random access memory)

In a method of manufacturing a semiconductor device according to one exemplary embodiment, a first interconnect trench and a second interconnect trench adjacent to this first interconnect trench are first formed in an interlayer insulating film made of a silicon oxide or the like. This interlayer insulating film is formed to a thickness sufficiently larger than the thickness of a first interconnect and a second interconnect to be formed later in these trenches. If this interlayer insulating film is too thick, it is difficult to precisely form the first interconnect trench and the second interconnect trench. It is also difficult to form the first interconnect and the second interconnect within the first interconnect trench and the second interconnect trench, respectively. Conversely, if this interlayer insulating film is too thin, it is difficult to set the thickness of the first mask insulating film and the second mask insulating film to be formed later to a desired thickness. The thickness of this interlayer insulating film is, for example, preferably 1.2 times or larger, more preferably 1.5 times or larger, and even more preferably 1.8 times or larger than the thickness of the first interconnect and second interconnect to be formed later. In addition, the thickness of this interlayer insulating film is preferably 5 times or less, more preferably 3 times or less, and even more preferably 2.5 times or less the thickness of the first and second interconnects.

Next, a first interconnect and a space on this first interconnect are provided within the first interconnect trench. Likewise, a second interconnect and a space on this second interconnect are provided within the second interconnect trench. This step can be carried out in the following way. First, a conductive film is formed on the interlayer insulating film, so as to fill the first interconnect trench and the second interconnect trench. After that, the portion of the conductive film external to the first interconnect trench and the second interconnect trench is removed. In addition, an upper portion (corresponding to the abovementioned space on the first interconnect) of the conductive film within the first interconnect trench and an upper portion (corresponding to the abovementioned space on the second interconnect) of the conductive film within the second interconnect trench are removed. At that time, the thickness of the first interconnect and the second interconnect to be left preferably satisfies the below-described ranges, according to a ratio of the thickness of the abovementioned interlayer insulating film to the thickness of the first interconnect and the second interconnect. A ratio (T/D) of a thickness T of the first interconnect and the second interconnect to a depth D (corresponding to the thickness of the interlayer insulating film) of the first interconnect trench and the second interconnect trench is preferably 1/5 or higher, more preferably 1/3 or higher, and even more preferably 1/2.5 or higher. In addition, the ratio is preferably 1/1.2 or lower, more preferably 1/1.5 or lower, and even more preferably 1/1.8 or lower.

Next, a first mask trench resulting from the first interconnect trench being increased in width is formed, and a second mask trench resulting from the second interconnect trench being increased in width is formed, through the execution of isotropic etching. Here, the width of the first interconnect trench and the width of the second interconnect trench refer to a size of the interconnect trenches in a direction thereof perpendicular to an extension direction (longitudinal direction) of the trenches.

A pitch P between the adjacent first mask trench and the second mask trench corresponds to the aperture size (aperture size along a direction perpendicular to the extension direction (longitudinal direction) of the first interconnect and the second interconnect) of a hole to be formed later, i.e., corresponds to the diameter of a via to be formed later in this hole.

As the result of such isotropic etching as described above, the width of the first and second interconnect trenches increases. In addition, the etching also progress toward a depth direction within these trenches. Consequently, upper-end side surfaces of the first interconnect and the second interconnect within the trenches become exposed. The side surfaces of the first interconnect and the second interconnect need not be exposed in whole. Preferably 50% or less, more preferably 30% or less, and even more preferably 20% or less of each side surface is exposed with respect to the thickness of the interconnects in the thickness direction thereof from an upper end of each interconnect. By performing etching so as to suppress the exposure of the side surface of each interconnect in this way, it is possible to secure a sufficient amount of space (pitch P) (i.e., obtain a desired via diameter) between adjacent trenches. In addition, it is possible to suppress parasitic capacitance between an interconnect and a plug adjacent thereto even if the dielectric constant of a masking insulating material is high.

Next, a masking insulating material is filled in the first mask trench and the second mask trench to form a first mask insulating film within the first mask trench and a second mask insulating film within the second mask trench. For this masking insulating material, it is possible to use a mask material, for example, a silicon nitride, for anisotropic etching to be performed later. This step can be carried out in the following way. First, a masking insulating film is formed on the abovementioned interlayer insulating film, so as to fill the first mask trench and the second mask trench. After that, the portion of the masking insulating film external to the first mask trench and the second mask trench is removed.

Next, anisotropic etching using the first mask insulating film and the second mask insulating film as masks is performed to form a hole passing through between the first interconnect and the second interconnect and penetrating the interlayer insulating film. At that time, this hole is formed self-alignedly with the first mask insulating film and the second mask insulating film.

Next, a conductive material is filled in the abovementioned hole to form a plug. This step can be performed in the following way. First, the conductive film is formed so as to fill the hole. After that, the portion of the conductive film external to this hole is removed.

The manufacturing method of the present exemplary embodiment is applicable in a case where a semiconductor device includes a memory cell array in which memory cells including transistors and storage elements are matrix-arranged; word lines constituting the gates of these transistors;

and bit lines intersecting with these word lines and connected to drains of these transistors. The abovementioned first interconnect and the second interconnect can be formed as these bit lines. In this case, the lower end of the abovementioned plug can be connected to a contact plug in contact with the semiconductor substrate, and the upper end of the abovementioned plug can be connected to a storage element.

The first interconnect and the second interconnect can be formed as these word lines.

In a case where each of the storage elements is a capacitor that includes an upper electrode, a lower electrode, and a capacitance insulating film provided therebetween, the upper end of the abovementioned plug (which can be formed as a contact plug) can be connected to this lower electrode.

Hereinafter, exemplary embodiments will be described by citing examples in which the embodiments are applied to a process of manufacturing a DRAM memory cell.

First Exemplary Embodiment

A method of manufacturing a DRAM memory cell according to a first exemplary embodiment will be described with reference to the accompanying drawings.

Figure 2:
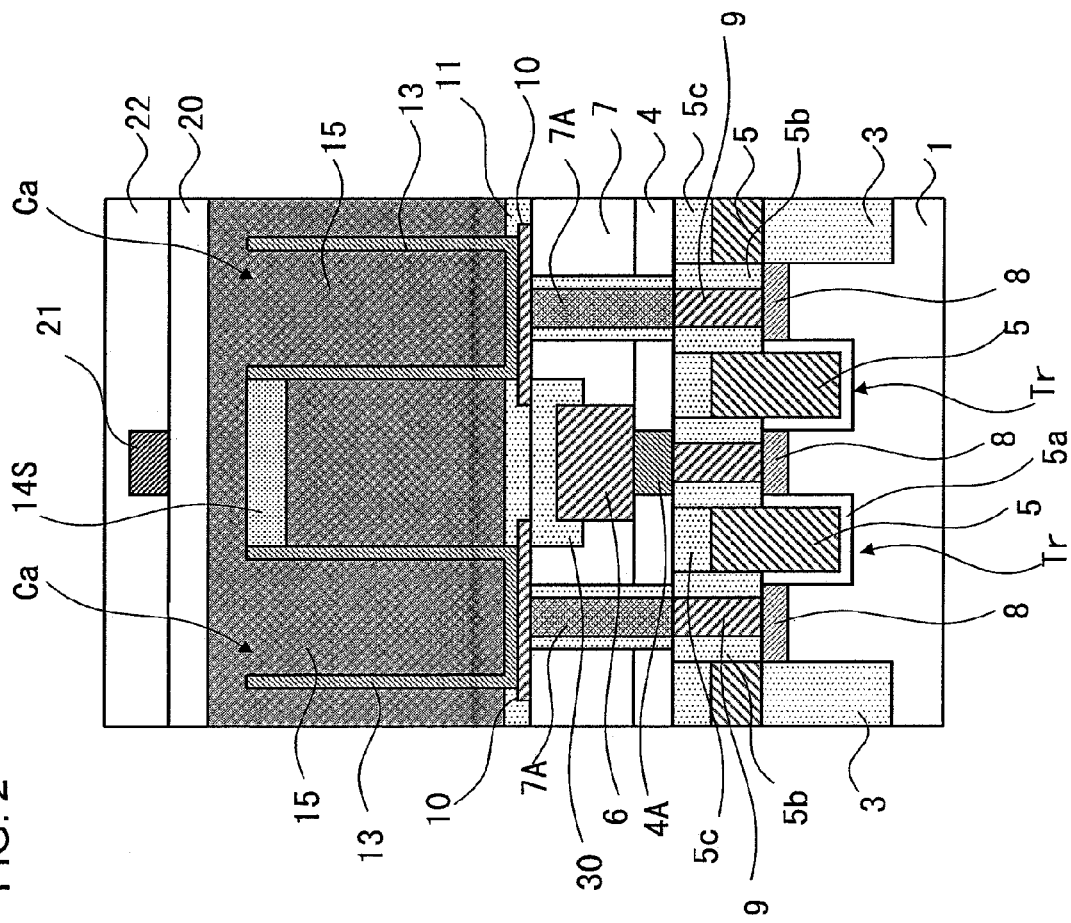
FIG. 2 is a cross-sectional view taken along the line A-A' of FIG. 1.

FIG. 1 illustrates a planar structure of a memory cell section of a DRAM according to the present exemplary embodiment. FIG. 1 is a plan view taken along a plane cutting through word lines W functioning as gate electrodes in the plane direction thereof. FIG. 2 is a cross-sectional view taken along the line A-A' of FIG. 1. In these figures, some components of the memory cell are omitted for ease of description.

In FIG. 1, active regions K and bit lines 6 are shown in a perspective manner. Reference characters 9a, 9b and 9c denote the positions of contact plugs on an active region K. Reference character 5b denotes a sidewall of a gate electrode (word line W), and reference numeral 3 denotes an element-isolating region. Note that contact plugs on active regions on the right of the figure are omitted. Likewise, hatching is omitted for word lines W (gate electrodes) shown from the central part to the left side of the figure.

Each memory cell includes MOS transistors Tr for the memory cell and capacitors (capacitive sections) Ca connected to these MOS transistors Tr through a plurality of plugs 9 and 7A, as illustrated in FIG. 2.

A semiconductor substrate 1 is formed of silicon (Si) containing a P-type impurity of a predetermined concentration. An element-isolating region 3 is formed in this semiconductor substrate 1. The element-isolating region 3 can be formed by an STI (Shallow Trench Isolation) process. That is, by forming trenches in the semiconductor substrate and burying an insulating film, such as a silicon oxide film ($SiO_2$), in these trenches, it is possible to obtain an element-isolating region surrounding an active region K and insulating and separating adjacent active regions K from each other. In the present exemplary embodiment, two bits of memory cells are disposed in one active region K.

Each active region K is elongate and reed-shaped, as illustrated in FIG. 1. The active region K is disposed so that one end of the active region K in the longitudinal direction thereof faces diagonally downward right (a predetermined angle is formed with respect to an X direction). Active regions K disposed in this way are laid out both in a Y direction and along the longitudinal direction of the active regions K. As a result, there is formed a layout of $6F^2$ memory cells.

Each active region K is disposed so as to intersect with two word lines. Impurity-diffused layers 8 are formed at the both edges and central part of each active region, respectively, and function as source/drain regions of each MOS transistor Tr. Substrate contact plugs 9 shown by reference characters 9a, 9b and 9c are laid directly on the source/drain regions (impurity-diffused layers).

Note that the shape and array direction of the active regions K are not limited to the arrangement of FIG. 1, but may be modified to the extent of being able to apply a layout of $6F^2$ memory cells.

As illustrated in FIG. 1, a plurality of bit lines 6 is extendedly provided in a polygonal-line (bend) form along the horizontal (X) direction of the figure, and is disposed in the vertical (Y) direction of the figure at predetermined pitches. Each bit line 6 includes a portion intersecting with an active region K and a portion extending along the longitudinal direction of the active region K (portion parallel to the longitudinal direction), and zigzags along the X direction.

As illustrated in FIG. 1, a plurality of word lines W is extendedly provided in a straight line along the vertical (Y) direction of the figure, and is disposed in the horizontal (X) direction of the figure at predetermined pitches. Each word line W functions as a gate electrode 5 at a portion of the word line that intersects with an active region K. In the present exemplary embodiment, each MOS transistor Tr is provided with a trench-type gate electrode. In this MOS transistor, a gate insulating film 5a is provided between a gate electrode 5 within a trench formed in the semiconductor substrate and the semiconductor substrate 1, and channels are formed on inner side surfaces of the trench, as illustrated in FIG. 2. A planar MOS transistor may be used in substitution for such a MOS transistor provided with a trench-type gate electrode.

As illustrated in FIG. 2, in the semiconductor substrate 1, the impurity-diffused layers 8 functioning as source/drain regions are formed within each active region K divided off by element-isolating regions 3. Adjacent impurity-diffused layers 8 within the active region K are separated from each other by a trench-type gate electrode 5.

Each gate electrode 5 is made of a multilayer film composed of a polysilicon film and a metal-based conductive film, and is formed so as to protrude upward from the semiconductor substrate 1. The polysilicon film for the gate electrode can be formed by a CVD (chemical vapor deposition) method, and is allowed to contain an impurity, such as phosphorous, at the time of film formation. Alternatively, an N-type or P-type impurity may be introduced by an ion-implantation method into a polysilicon film formed so as not to contain any impurities at the time of film formation. As the metal-based conductive film for gate electrodes, it is possible to use high-melting point metal, such as tungsten (W), a tungsten nitride (WN) or a tungsten silicide (WSi).

Sidewalls 5b made of an insulating film, such as a silicon nitride ($Si_3N_4$) film, are formed on side surfaces of each gate electrode 5. In addition, an on-gate insulating film 5c, such as a silicon nitride film, is formed on an upper surface of each gate electrode 5. The protruding portion of the gate electrode 5 is thus protected.

Each impurity-diffused layer 8 is formed by introducing, for example, phosphorous as the N-type impurity into the semiconductor substrate 1 containing a P-type impurity.

As illustrated in FIG. 2, each substrate contact plug 9 is formed so as to have contact with an impurity-diffused layer 8. Substrate contact plugs 9 are provided in the first interlayer insulating film and, as illustrated in FIG. 1, are disposed in positions shown by reference characters 9a, 9b and 9c. Each substrate contact plug 9 can be formed by forming a hole in the first interlayer insulating film formed on the semiconductor substrate and filling polysilicon containing, for example, phosphorous into this hole. The width of each substrate contact plug 9 in the horizontal (X) direction of the figure is defined by sidewalls 5b of adjacent word lines W (gate electrodes). Thus, the memory cells have a self-aligned structure.

As illustrated in FIG. 2, a second interlayer insulating film 4 is formed so as to cover the on-gate insulating films 5c, sidewalls 5b, substrate contact plugs 9, and the first interlayer insulating film (not illustrated).

A bit line contact plug 4A is formed so as to penetrate the second interlayer insulating film 4. The bit line contact plug 4A is located at a position shown by reference character 9a in FIG. 1, and is in electrical conduction with a substrate contact plug 9 directly underneath the bit line contact plug 4A. The bit line contact plug 4A can be formed by laminating tungsten (W) or the like on a barrier film made of a laminated film (TiN/Ti laminated film) of titanium (Ti) and a titanium nitride (TiN). A bit line 6 is formed so as to connect to the bit line contact plug 4A. The bit line 6 can be formed of a laminated film made of a tungsten nitride (WN) and tungsten (W).

A third interlayer insulating film 7 and a mask insulating film 30 are provided so as to bury the bit line 6. The mask insulating film 30 is formed of a material (for example, a silicon nitride) different from the material of the third interlayer insulating film 7 (for example, a silicon oxide film), and is provided so as to cover an upper end of the bit line 6.

Capacitance contact plugs 7A are formed through the second interlayer insulating film 4 and the third interlayer insulating film 7, so as to connect to the substrate contact plugs 9. The capacitance contact plugs 7A are disposed directly on the substrate contact plugs 9 at positions shown by reference characters 9b and 9c in FIG. 1.

Capacitance contact pads 10 in electrical conduction with the capacitance contact plugs 7A are disposed on the third interlayer insulating film 7. The capacitance contact pads 10 can be formed of a laminated film made of a tungsten nitride (WN) and tungsten (W).

A fourth interlayer insulating film 11 made of a silicon nitride is formed so as to cover the capacitance contact pads 10.

Lower electrodes 13 of capacitors Ca are formed through the fourth interlayer insulating film 11, so as to connect to the capacitance contact pads 10. The capacitors Ca in the present exemplary embodiment include such crown-shaped lower electrodes as illustrated in the figure.

Each capacitor Ca has a structure in which a capacitance insulating film (not illustrated) is sandwiched between a lower electrode 13 and an upper electrode 15, and the lower electrode 13 is in electrical conduction with a capacitance contact pad 10. As the capacitance insulating film, a high-k film, such as a zirconium oxide ($ZrO_2$) film, can be used.

A support film 14S in contact with the upper ends of sidewalls of the two lower electrodes 13 is provided between adjacent lower electrodes 13. The lower electrodes 13 are supported by each other through this support film 14S. The support film 14S can be formed using an insulating film, such as a silicon nitride film. The lower electrodes 13 are prevented by the support film 14S from collapsing in the course of a manufacturing process.

Capacitors for storage operation are not disposed in regions other than the memory cell section of a DRAM (peripheral circuit regions and the like). Instead, a fifth interlayer insulating film (not illustrated) made of a silicon oxide or the like is formed on a fourth interlayer insulating film 11.

A sixth interlayer insulating film 20 is formed over the capacitors Ca. In addition, an upper interconnect layer 21 made of a conductive material, such as aluminum (Al), copper (Cu) or the like, is formed on this sixth interlayer insulating film 20. Yet additionally, there is formed a surface protection film 22 covering the upper interconnect layer 21.

Next, one example of a method for manufacturing the DRAM memory cell discussed using FIGS. 1 and 2 will be described with reference to FIG. 3 to FIG. 13. FIGS. 3A to 13A are schematic cross-sectional views corresponding to a cross section viewed along the line A-A' of FIG. 1 illustrating the memory cell section. Likewise, FIGS. 3B to 13B are schematic cross-sectional views corresponding to a cross section viewed along the line B-B' of FIG. 1 illustrating the memory cell section.

Figure 3A:
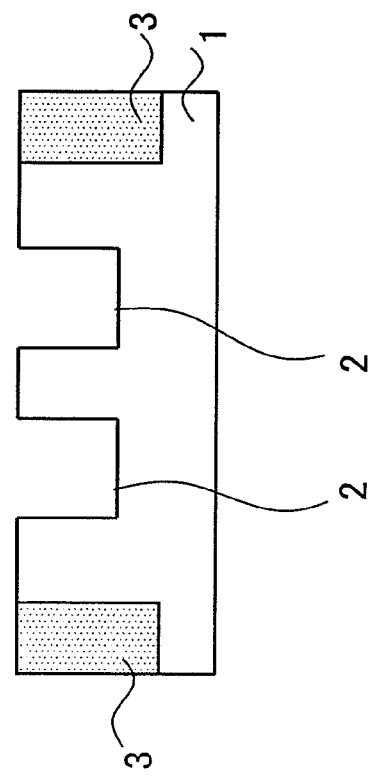
FIGS. 3A and 3B are cross-sectional views for explaining a step in a method of manufacturing the structure illustrated in FIGS. 1 and 2 according to one exemplary embodiment.
Figure 3B:
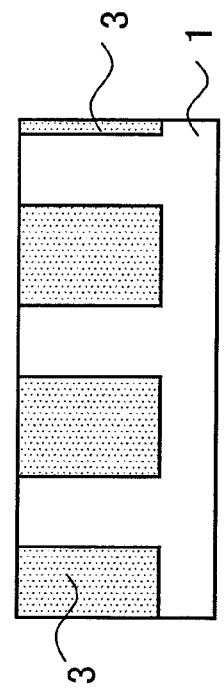

First, as illustrated in FIGS. 3A and 3B, the element-isolating regions 3 are formed on a principal surface of the semiconductor substrate 1 made of P-type silicon to form active regions divided off by the element-isolating regions 3. The element-isolating regions 3 can be formed by an STI method. That is, trenches are formed in the semiconductor substrate. Then, an insulating material, such as a silicon oxide, is filled in these trenches. Consequently, there are obtained element-isolating regions corresponding to regions where the trenches are formed. The activated regions are provided in positions shown by reference character K, as illustrated in FIG. 1.

Next, as illustrated in FIG. 3A, trenches 2 for the gate electrodes of MOS transistors Tr are formed on the principal surface of the semiconductor substrate 1. The trenches 2 can be formed by forming a resist pattern on the to semiconductor substrate 1 by a photolithographic technique, and performing anisotropic etching using this resist pattern as a mask.

Next, a silicon surface of the semiconductor substrate 1 is oxidized by a thermal oxidation method to form an approximately 4 nm-thick silicon oxide film on the semiconductor substrate surface including the inner portions of the trenches 2. Portions of the silicon oxide film left in the trenches 2 after the later-described formation of gate electrodes serve as gate insulating films 5a (FIG. 4A). As the gate insulating film, a laminated film of a silicon oxide and a silicon nitride or a high-K film (high-dielectric constant film) may be used.

After this, a polysilicon film containing an N-type impurity is deposited on the gate insulating films 5a by a CVD method using monosilane ($SiH_4$) and phosphine ($PH_3$) as raw material gases. At that time, the polysilicon film is set to such a thickness as to completely fill the inside of the trenches 2 for gate electrodes. Alternatively, there may be formed a polysilicon film not containing an impurity such as phosphorous. Then, a desired impurity may be introduced into the polysilicon film by an ion implantation method in a later step.

Next, a high melting point metal-based material, such as tungsten, a tungsten nitride or a tungsten silicide, is deposited on the polysilicon film by a sputtering method to a thickness of approximately 50 nm. From a laminated film made of the metal-based film formed in this way and the polysilicon film, there are obtained gate electrodes 5 having a predetermined pattern after later-described steps.

Next, an insulating film 5c made of a silicon nitride is deposited on the metal-based film to a thickness of approximately 70 nm by a parallel plate type PE-CVD (plasma enhanced chemical vapor deposition) method using monosilane and ammonia ($NH_3$) as raw material gases.

Next, a resist pattern for gate electrode formation is formed on the insulating film 5c by a photolithographic technique. The insulating film 5c is patterned by performing anisotropic etching using this resist pattern as a mask. After the resist pattern is removed, the metal-based film and the polysilicon film are etched using the patterned insulating film 5c as a hard mask, thereby forming gate electrodes 5 (FIG. 4A). The gate electrodes 5 function as the word lines W illustrated in FIG. 1. Note that in FIG. 4A, the metal film and the polysilicon film constituting the gate electrodes 5 are shown by the same hatching and are thus drawn without distinguishing between the films.

Figures 5A, 5B:
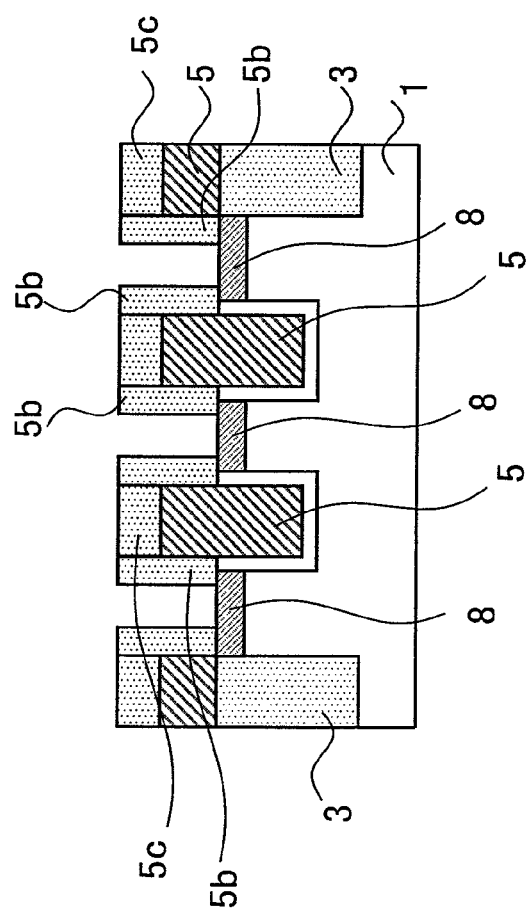
FIGS. 5A and 5B are cross-sectional views for explaining a step following the step of forming the structure illustrated in FIGS. 4A and 4B.

Next, as illustrated in FIGS. 5A and 5B, phosphorous is ion-implanted as an N-type impurity to form impurity-diffused layers 8 in active regions not covered with the gate electrodes 5.

After this, a silicon nitride film is deposited across the entire surface of the memory cell by an LP-CVD (low pressure chemical vapor deposition) method, to a thickness of approximately 20 to 50 nm. The silicon nitride film is then etched back to form the sidewalls 5b on the side surfaces of each gate electrode 5, as illustrated in FIG. 5A.

Next, a first interlayer insulating film 25 made of an insulating material, such as a silicon oxide, is formed by a CVD method, so as to cover the on-gate insulating films 5c and the sidewalls 5b. After that, surface polishing is performed by a CMP (Chemical Mechanical Polishing) method, in order to planarize irregularities resulting from the gate electrodes 5. This polishing is stopped as soon as upper surfaces of the on-gate insulating films 5c become exposed.

After this, the substrate contact plugs 9 are formed as illustrated in FIGS. 6A and 6B. Specifically, a resist pattern that has openings in positions shown by reference characters 9a, 9b and 9c in FIG. 1 is first formed by a lithography technique. Then, etching is performed using this resist pattern as a mask to form holes penetrating the first interlayer insulating film. Each of these holes is formed between adjacent gate electrodes 5 by means of self-alignment taking advantage of a difference in etch rate between the insulating films 5c and 5b formed of a silicon nitride and the interlayer insulating film formed of a silicon oxide. After this, a phosphorous-containing polysilicon film is deposited by a CVD method. Then, polishing is performed by a CMP method to remove the excess portion of the polysilicon film external to the holes. As a result, there are formed the substrate contact plugs 9 made of polysilicon filled in the holes.

After this, a second interlayer insulating film 4 made of a silicon oxide is formed by a CVD method to a thickness of, for example, approximately 600 nm, so as to cover the substrate contact plugs 9, the on-gate insulating films 5c, the sidewalls 5b and the first interlayer insulating film 25. Thereafter, a surface of the second interlayer insulating film 4 is polished and planarized by a CMP method until a thickness of, for example, approximately 300 nm is reached. In this way, there are obtained the structures illustrated in FIGS. 6A and 6B.

Next, a hole penetrating the second interlayer insulating film 4 is formed by a photolithographic technique and a dry etching technique in a position shown by reference character 9a in FIG. 1, thereby exposing a surface of the substrate contact plug 9. A conductive film in which tungsten (W) is laminated on a barrier film made of a TiN/Ti laminated film or the like is deposited, so as to fill this hole. Subsequently, a surface of the conductive film is polished by a CMP method to remove the excess portion of the conductive film external to the hole, thereby forming a bit line contact plug 4A.

After this, a third interlayer insulating film 7 made of a silicon oxide or the like is formed, so as to cover an upper surface of the bit line contact plug 4A. The thickness of the third interlayer insulating film 7 is preferably set so as to be approximately twice the film thickness of a later-formed bit line 6.

Next, as illustrated in FIGS. 7A and 7B, trenches 210 for bit line formation are formed in the third interlayer insulating film 7 by a photolithographic technique and a dry etching technique. The trenches 210 are formed in positions corresponding to the bit lines 6 shown in FIG. 1. Dry etching performed to form the trenches 210 is stopped as soon as an upper surface of the bit line contact plug 4A becomes exposed at a site where a trench 210 and the bit line contact plug 4A intersect with each other.

Next, a conductive film in which tungsten (W) is laminated on a barrier film made of a TiN/Ti laminated film or the like is deposited, so as to fill the trenches 210 with the conductive film. After this, an etch back is performed to remove the excess portion of the conductive film external to the trenches 210. By further performing the etch back, the conductive film is allowed to remain within the trenches 210 to a thickness approximately half the thickness of the third interlayer insulating film 7. As a result, there are formed the bit lines 6 made of the remaining conductive film (FIGS. 8A and 8B). When the etch back is performed, dry etching and wet etching may be used concomitantly. When wet etching is performed, it is possible to selectively remove tungsten with respect to the silicon oxide by using, for example, a hydrogen peroxide solution ($H_2O_2$) as a chemical solution.

Figure 9B:
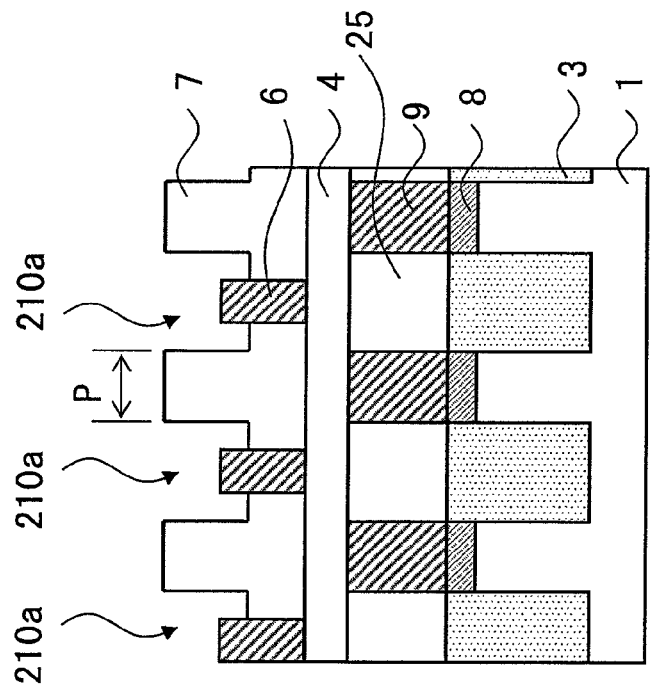
FIGS. 9A and 9B are cross-sectional views for explaining a step following the step of forming the structure illustrated in FIGS. 8A and 8B.
Figure 9A:
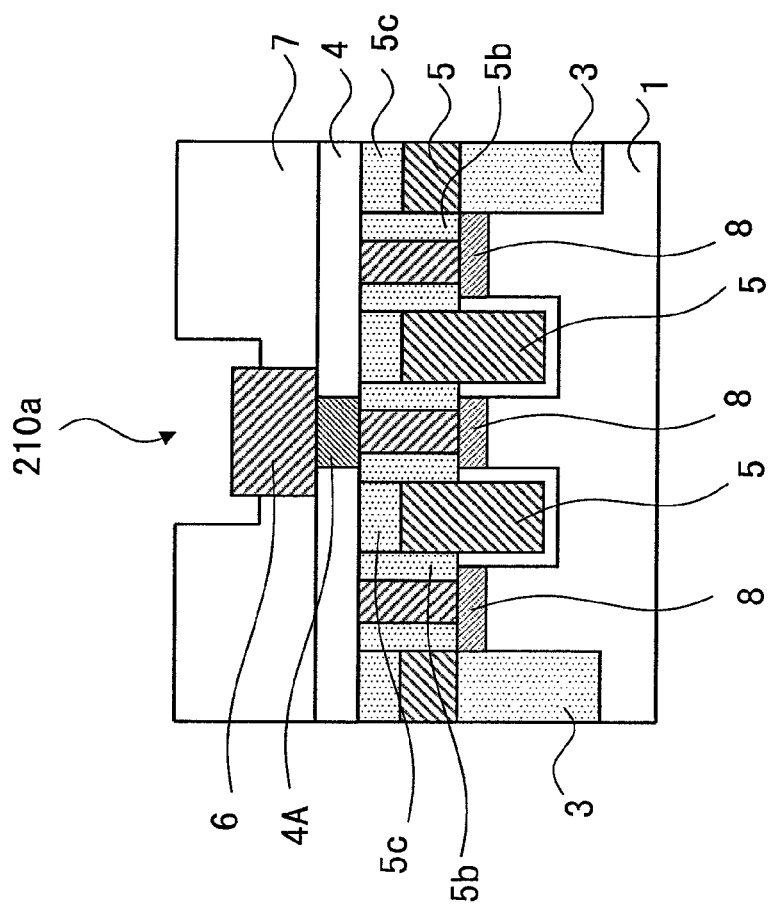

Next, trenches 210a for a mask resulting from the width of the trenches 210 being increased are formed by performing wet etching using diluted hydrofluoric acid (HF) as a chemical solution (FIGS. 9A and 9B). This wet etching progresses isotropically with respect to the third interlayer insulating film 7. Consequently, the width of the trenches 210 increases and an upper surface of the third interlayer insulating film 7 is also etched, thereby decreasing the thickness thereof. Upper-end side surfaces of the bit lines 6 accordingly become exposed. In FIG. 9B, the width of capacitance contact plugs 7A to be formed in later steps is defined by a width P of the convex portion of an upper surface side of the third interlayer insulating film 7.

Figure 10A:
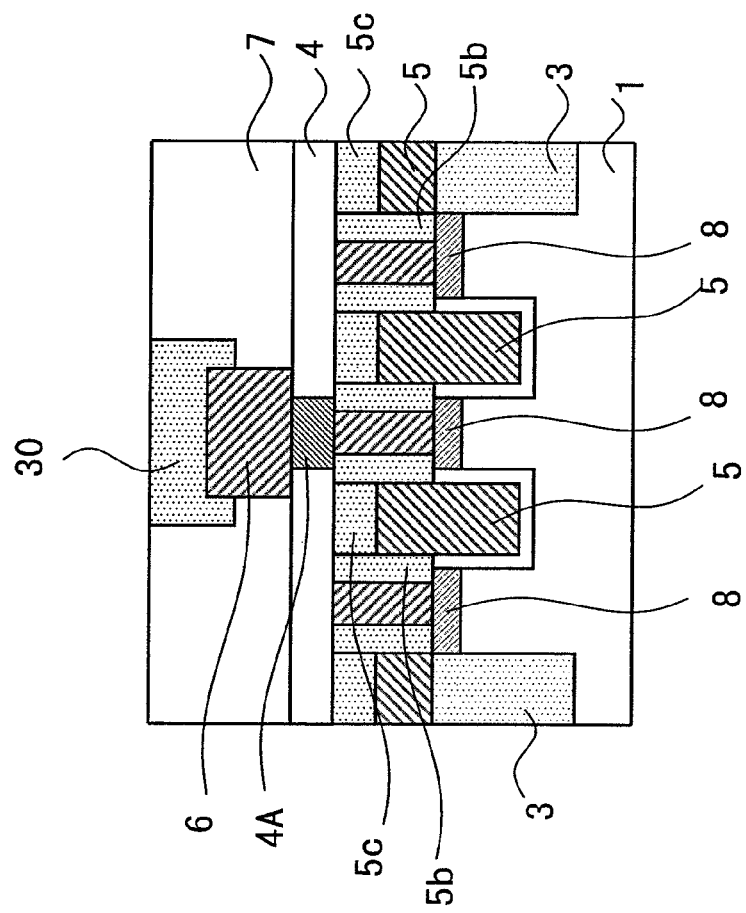
FIGS. 10A and 10B are cross-sectional views for explaining a step following the step of forming the structure illustrated in FIGS. 9A and 9B.
Figure 10B:
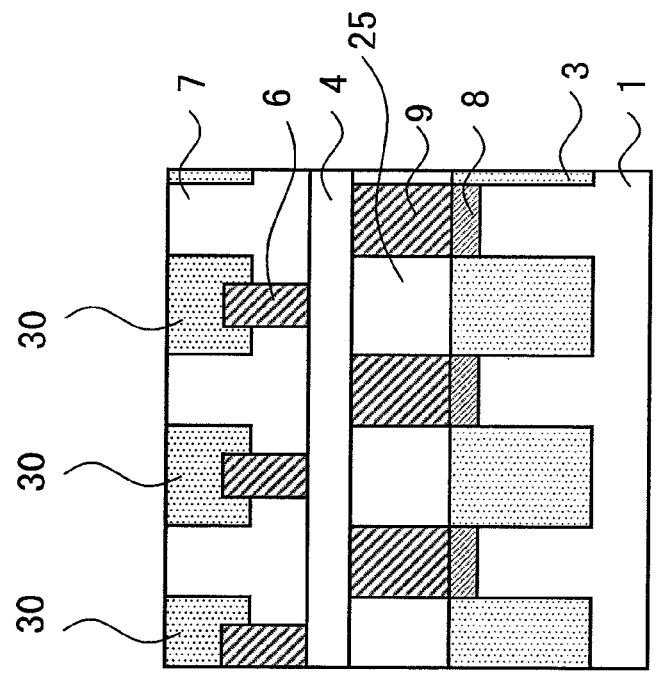

Next, a silicon nitride film is formed so as to fill the widened trenches 210a. Subsequently, CMP is performed to planarize an upper surface of the silicon nitride film and remove the excess portion thereof external to the trenches 210a. As a result, as illustrated in FIGS. 10A and 10B, there are obtained mask insulating films 30 provided within the trenches 210a. As the material of the mask insulating films 30, it is possible to use, in addition to the silicon nitride, a material capable of ensuring an adequate etching selection ratio with respect to the material of the third interlayer insulating film 7 at the time of dry etching.

Figure 11A:
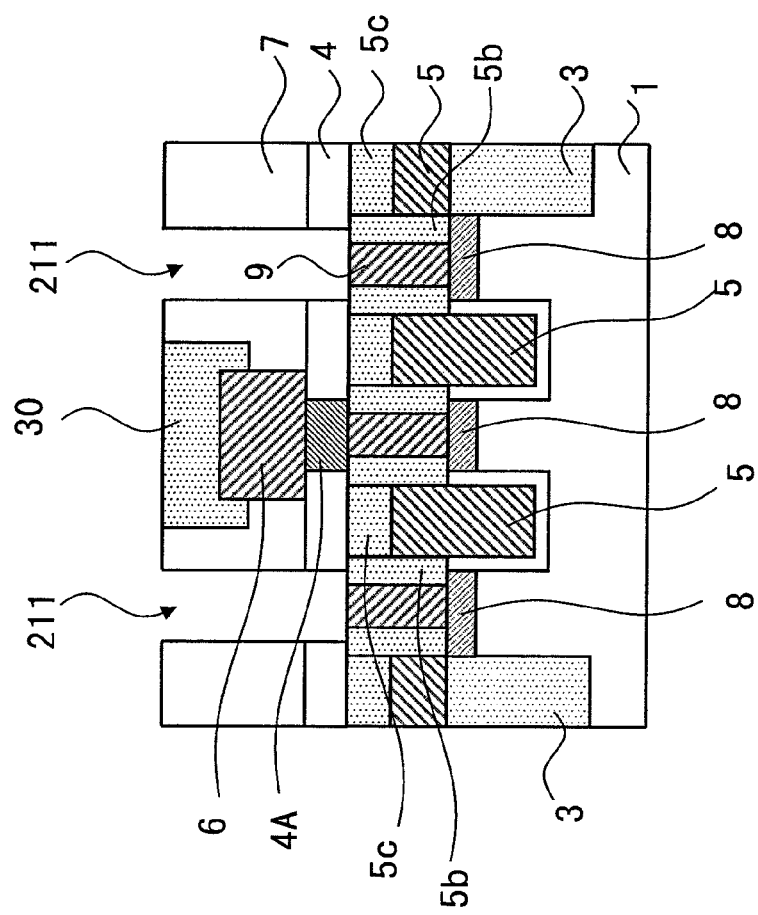
FIGS. 11A and 11B are cross-sectional views for explaining a step following the step of forming the structure illustrated in FIGS. 10A and 10B.
Figure 11B:
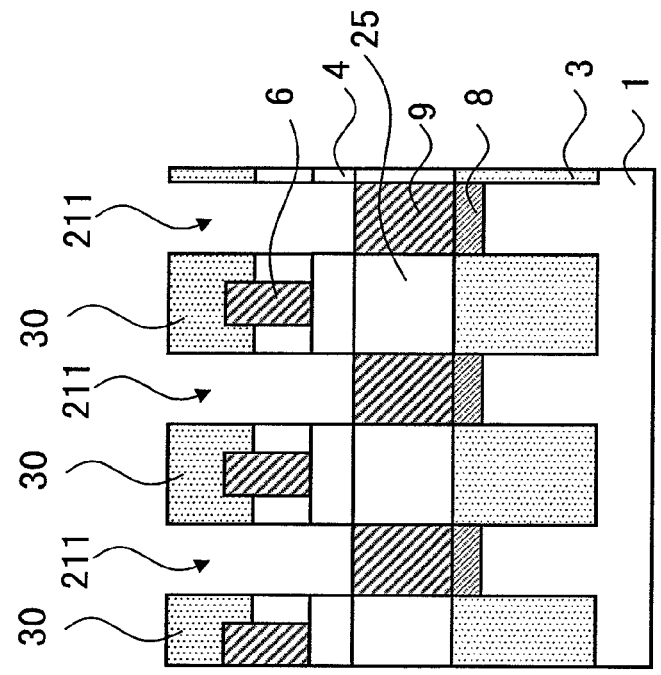

Next, a resist pattern that has openings in positions shown by reference characters 9b and 9c in FIG. 1 is formed by a photolithographic technique. Then, dry etching is performed using this resist pattern as a mask to form capacitance contact holes 211 (FIGS. 11A and 11B). The capacitance contact holes 211 are formed so as to penetrate the second and third interlayer insulating films 4 and 7. Thus, upper surfaces of the substrate contact plugs 9 are exposed on the bottoms of these capacitance contact holes. At that time, as illustrated in FIG. 11B, capacitance contact holes 211 the width of which is defined by mask insulating films 30 are formed in a region extending along the direction of the line B-B' of FIG. 1 in a self-aligned manner with respect to the bit lines 6. Since any mask insulating films for defining the width of the capacitance contact holes 211 are not disposed in a region extending along the direction of the A-A' line of FIG. 1, the positions of the capacitance contact hole 211 are defined by a resist pattern (mask). In the present exemplary embodiment, a capacitance contact hole 211 to be disposed between bit lines 6 is formed self-alignedly with the bit lines 6. Consequently, it is possible to form a fine pattern layout while avoiding short-circuiting.

Note that the resist pattern (mask) may include openings that correspond to individual capacitance contact holes 211, or linear (belt-like) openings extending along the Y direction of FIG. 1.

Next, sidewall insulating films 31 for covering inner side surfaces of the capacitance contact holes 211 are formed. These sidewall insulating films 31 can be formed of a silicon nitride film or a silicon oxide film. These sidewall insulating films 31 make insulating separation between a capacitance contact plug and a bit line 6 more reliable. These sidewall insulating films 31 may be omitted as long as insulating separation between the capacitance contact plug and the bit line 6 can be ensured.

Figure 12B:
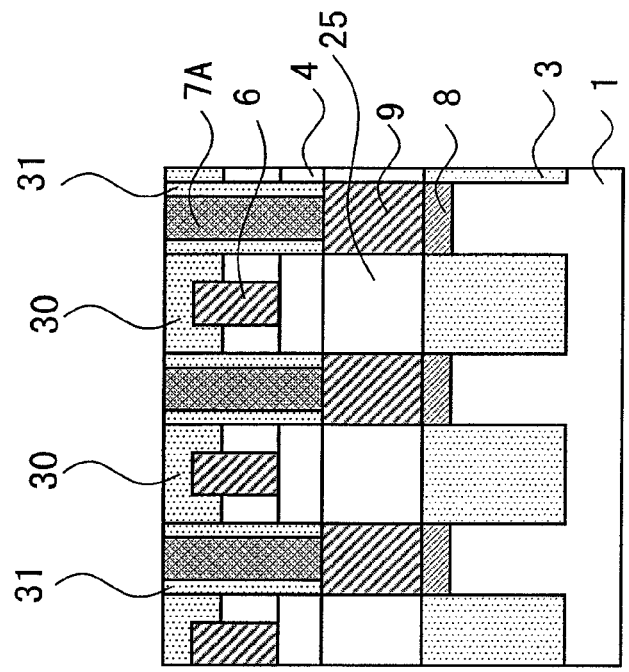
FIGS. 12A and 12B are cross-sectional views for explaining a step following the step of forming the structure illustrated in FIGS. 11A and 11B.
Figure 12A:
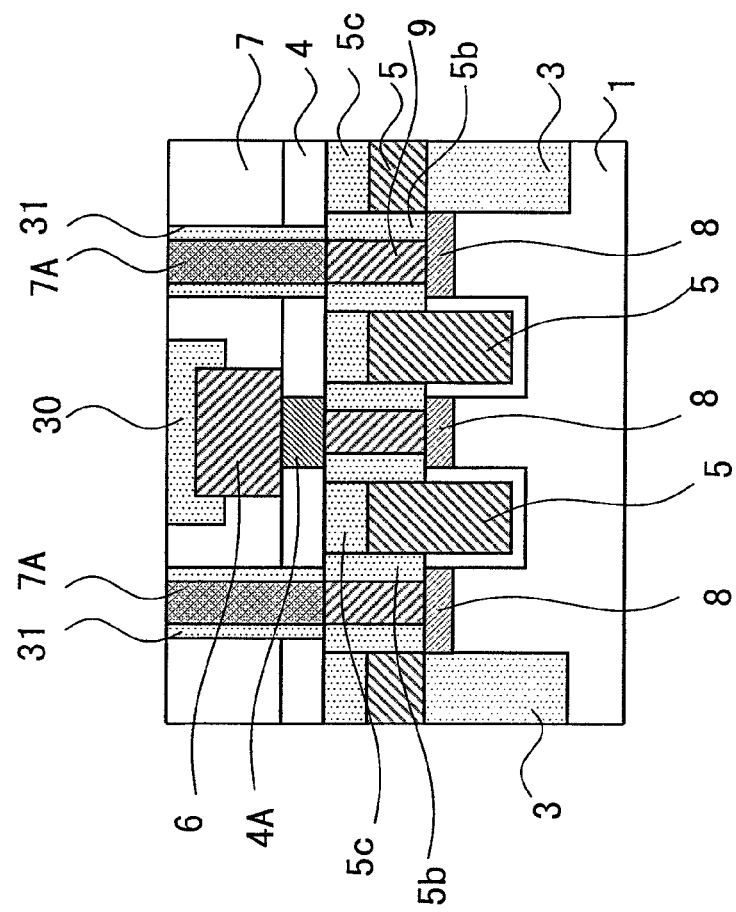
Figure 13B:
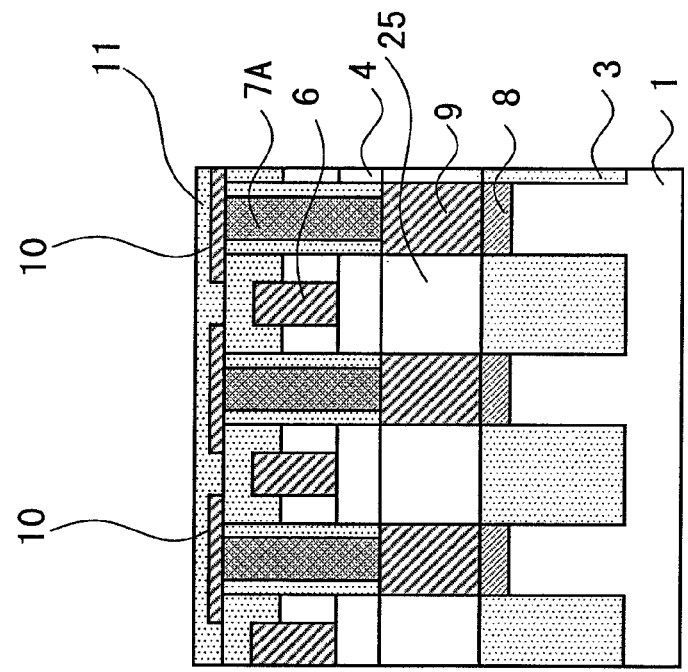
FIGS. 13A and 13B are cross-sectional views for explaining a step following the step of forming the structure illustrated in FIGS. 12A and 12B.
Figure 13A:
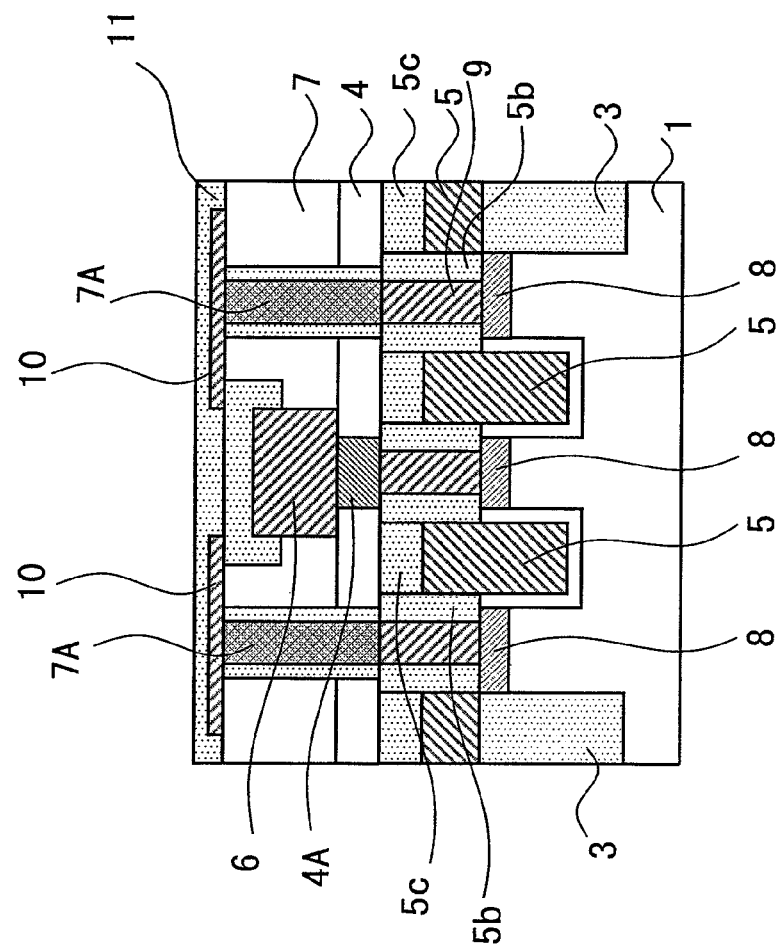

Subsequently, a conductive film in which tungsten (W) is laminated on a barrier film made of a TiN/Ti laminated film or the like is deposited, so as to fill the capacitance contact holes 211. Then, a surface of the conductive film is polished by a CMP method to remove the excess portion of the conductive film external to the holes, thereby forming capacitance contact plugs 7A (FIG. 12).

Next, capacitance contact pads 10 are formed on the third interlayer insulating film 7 by using a tungsten-containing laminated film. The capacitance contact pads 10 are laid directly on the capacitance contact plugs 7A, so as to be in electrical conduction therewith. These capacitance contact pads are set to a size larger than a size of the bottom of a capacitor lower electrode to be formed later. Subsequently, a fourth interlayer insulating film 11 made of, for example, a silicon nitride film is deposited by an LP-CVD method to a thickness of, for example, 60 nm, so as to cover the capacitance contact pads 10 (FIG. 13).

After this, capacitors and the like are formed in a usual way, thereby completing the memory cells of a DRAM illustrated in FIG. 2.

In the present exemplary embodiment, bit lines are formed by filling the material thereof in trenches provided in an interlayer insulating film. Accordingly, it is possible to avoid the collapse of interconnect layers (bit lines). Thus, a high-aspect ratio interconnect layer can be formed with an excellent yield. Consequently, it is possible to suppress a rise in interconnect resistance due to miniaturization.

In addition, in the present exemplary embodiment, a contact plug can be formed in a self-aligned manner between bit lines formed as described above. Consequently, it is possible to avoid short-circuiting between a bit line and a contact plug. Thus, it is possible to miniaturize interconnects and easily densify layouts.

Yet additionally, as illustrated in FIG. 10B, the mask insulating films 30 cover only the upper ends (upper surfaces and part of side surfaces) of the bit lines 6. Accordingly, it is possible to suppress a rise in parasitic capacitance between a bit line 6 and a capacitance contact plug 7A, even if a silicon nitride higher in dielectric constant than a silicon oxide is used as the mask insulating films 30.

Second Exemplary Embodiment

In the above-described first exemplary embodiment, a capacitance contact plug is formed in a self-aligned manner between bit lines. In the present exemplary embodiment, a case in which a substrate contact plug is formed in a self-aligned manner between word lines will be described using the accompanying drawings. FIGS. 14 to 18 are schematic cross-sectional views corresponding to a cross section viewed along the line A-A' of FIG. 1.

First, element-isolating regions 3 are formed on a principal surface of a semiconductor substrate 1 made of P-type silicon to form active regions K divided off by the element-isolating regions 3.

Figure 14:
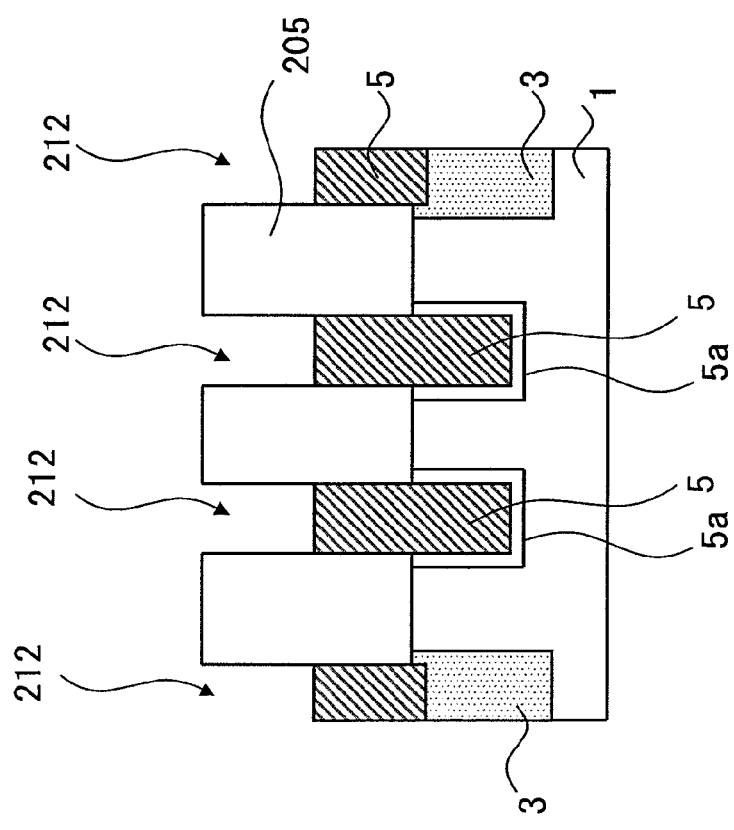
FIG. 14 is a cross-sectional view for explaining a step in a manufacturing method according to another exemplary embodiment.

Next, an interlayer insulating film 205 made of a silicon oxide is formed on the semiconductor substrate 1. Then, portions of the interlayer insulating film 205 at positions where word lines W are to be formed are etched (the semiconductor substrate 1 is additionally etched in the active regions) to form trenches 212 for the word lines (gate electrodes). Subsequently, thermal oxidation is performed to form gate insulating films 5a on silicon surfaces exposed inside trenches 212 in the active regions, to a thickness of approximately 4 nm. After that, a conductive film for word lines (gate electrodes) is formed, so as to fill the trenches 212, and is etched back, thereby forming the word lines (gate electrodes 5) only within the trenches 212. By the process described above, there is obtained a structure in which the word lines (gate electrodes 5) and spaces thereon are provided within the trenches 212 of the interlayer insulating film 205, as illustrated in FIG. 14.

Figure 15:
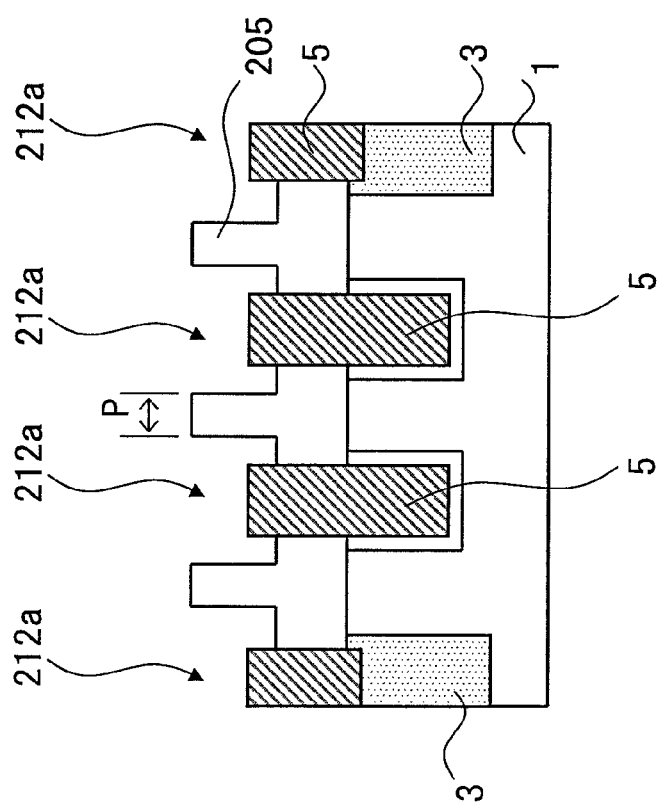
FIG. 15 is a cross-sectional view for explaining a step following the step of forming the structure illustrated in FIG. 14.

Next, trenches 212a resulting from the trenches 212 being increased in width are formed by performing wet etching using diluted hydrofluoric acid (HF) as a chemical solution (FIG. 15). This wet etching progresses isotropically with respect to the interlayer insulating film 205. Consequently, the width of the trenches 212 increases and an upper surface of the interlayer insulating film 205 is also etched, thereby decreasing the thickness thereof. Upper-end side surfaces of the gate electrodes 5 accordingly become exposed. In FIG. 15, the width of substrate contact plugs 9 to be formed in later steps is defined by a width P of the convex portion of an upper surface side of the interlayer insulating film 205.

Figure 16:
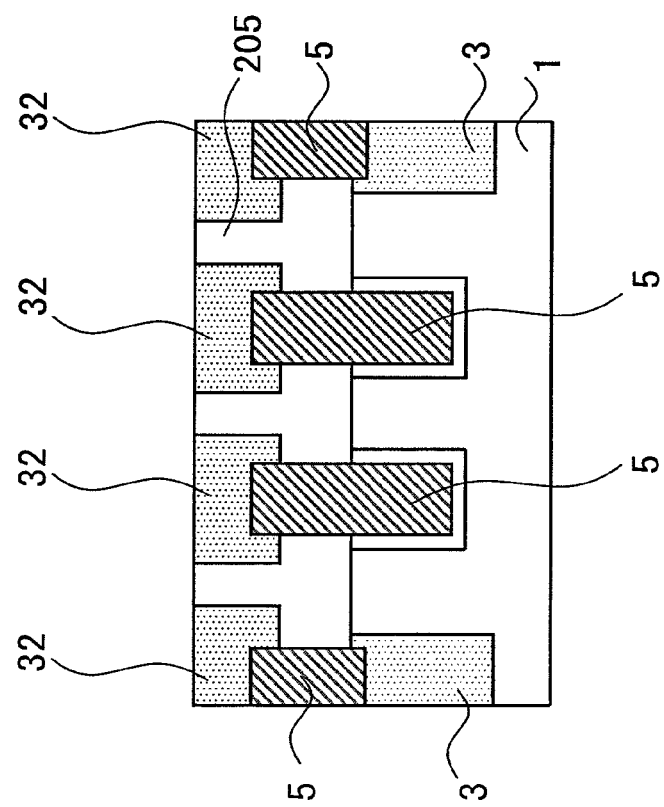
FIG. 16 is a cross-sectional view for explaining a step following the step of forming the structure illustrated in FIG. 15.

Next, a silicon nitride film is formed so as to fill the widened trenches 212a. Subsequently, CMP is performed to planarize an upper surface of the silicon nitride film and remove the excess portion thereof external to the trenches 212a. As a result, there are obtained mask insulating films 32 provided within the trenches 212a (FIG. 16). As the material of the mask insulating films 32, it is possible to use, in addition to the silicon nitride, a material capable of ensuring an adequate etching selection ratio with respect to the material of the interlayer insulating film 205 at the time of dry etching.

Figure 17:
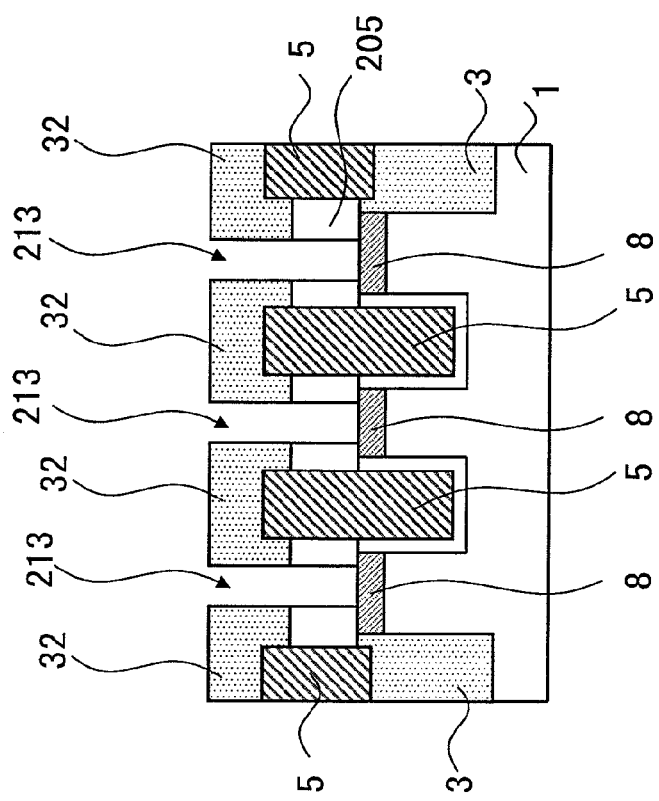
FIG. 17 is a cross-sectional view for explaining a step following the step of forming the structure illustrated in FIG. 16.

Next, a resist pattern that has openings in positions shown by reference characters 9a, 9b and 9c in FIG. 1 is formed by a photolithographic technique. Then, dry etching is performed using this resist pattern as a mask to form substrate contact holes 213 (FIG. 17). The substrate contact holes 213 are formed so as to penetrate the interlayer insulating films 205. Thus, an upper surface of the semiconductor substrate 1 is exposed on the bottoms of these substrate contact holes. At that time, as illustrated in FIG. 17, substrate contact holes 213 the width of which is defined by mask insulating films 32 are formed in a region extending along the direction of the line A-A' of FIG. 1 in a self-aligned manner with respect to the gate electrodes 5. Since any mask insulating films for defining the width of the substrate contact holes 213 are not disposed in a region extending along the direction of the B-B' line of FIG. 1, the positions of the substrate contact holes 213 are defined by a resist pattern (mask). In the present exemplary embodiment, each substrate contact hole 213 disposed between gate electrodes 5 functioning as word lines is formed self-alignedly with the gate electrodes 5. Consequently, it is possible to form a fine pattern layout while avoiding short-circuiting.

Next, as illustrated in FIG. 17, an N-type impurity, such as phosphorous, is ion-implanted through the substrate contact holes 213 to form N-type impurity-diffused layers 8. A heat treatment may be performed after the ion-implantation to horizontally diffuse the impurity-diffused layers 8. The impurity-diffused layers 8 function as source/drain electrodes of a MOS transistor.

Figure 18:
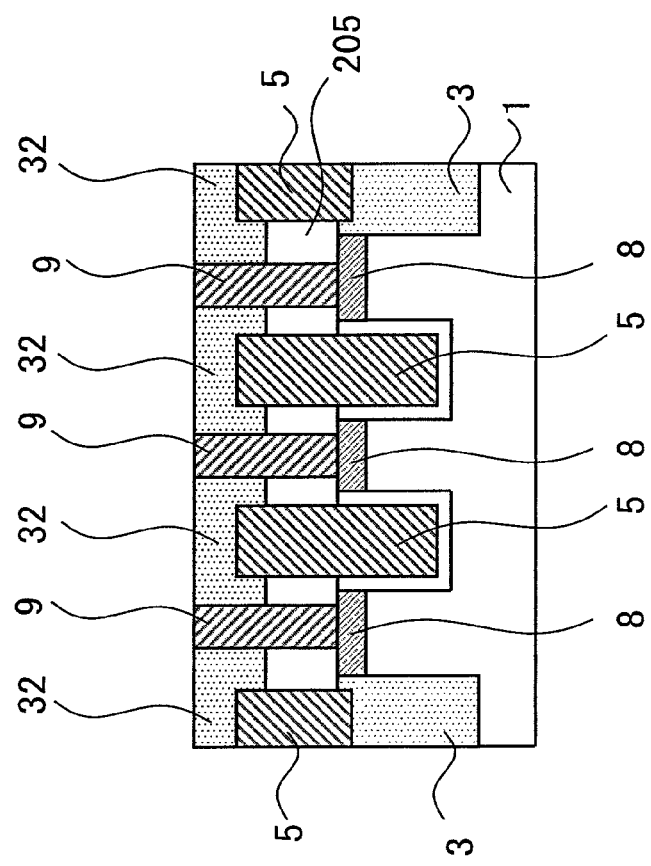
FIG. 18 is a cross-sectional view for explaining a step following the step of forming the structure illustrated in FIG. 17.

Next, a conductive film, such as a polysilicon film, is deposited so as to fill the substrate contact holes 213. Subsequently, a surface of the conductive film is polished by a CMP method to remove the excess portion of the conductive film external to the holes, thereby forming substrate contact plugs 9 (FIG. 18).

After this, bit lines, capacitors and the like are formed in a usual way, thereby completing the memory cells of a DRAM.

Bit lines and capacitance contact plugs may be formed by the methods described in the first exemplary embodiment.

In the present exemplary embodiment, word lines are formed by filling the material thereof in trenches provided in an interlayer insulating film. Accordingly, it is possible to avoid the collapse of interconnect layers (word lines). Thus, a high-aspect ratio interconnect layer can be formed with an excellent yield. Consequently, it is possible to suppress a rise in interconnect resistance due to miniaturization.

In addition, in the present exemplary embodiment, each contact plug can be formed in a self-aligned manner between word lines formed as described above. Consequently, it is possible to avoid short-circuiting between a word line and a contact plug. Thus, it is possible to miniaturize interconnects and easily densify layouts.

Yet additionally, as illustrated in FIG. 18, the mask insulating films 32 cover only the upper ends (upper surfaces and part of side surfaces) of the gate electrodes 5 functioning as the word lines. Accordingly, it is possible to suppress a rise in parasitic capacitance between each gate electrode 5 and each substrate contact plug 9, even if a silicon nitride higher in dielectric constant than a silicon oxide is used as the mask insulating films 32.

The exemplary embodiments heretofore described are examples of application to memory cells of a DRAM. The exemplary embodiments are also applicable, when bit lines are formed in a semiconductor device provided with a memory cell including a selection transistor and a storage element, such as a phase-change memory (PRAM) or a resistance-change memory (RRAM), in addition to DRAM memory cells. In the case of the DRAM, a capacitor functions as a storage element. In the case of the phase-change memory, an element in which such a material as a chalcogenide film the resistance of which varies upon heating is held between electrodes can be utilized as a storage element. In the case of the resistance-change memory, a metal oxide the resistance of which varies upon application of a pulsed voltage or current can be utilized as a storage element.

In addition, the present invention is not limited to the formation of memory cells, but is applicable when forming a structure in which a via plug passing through between interconnects provided on a semiconductor substrate and not short-circuiting to the interconnects is provided.

According to a manufacturing method of an exemplary embodiment, it is possible to form a high-aspect ratio interconnect layer. Consequently, a rise in interconnect resistance can be suppressed even if interconnects are made finer.

In addition, since a via plug can be placed between interconnects in a self-aligned manner, layouts can be easily densified while avoiding the short-circuiting of the interconnects and the via plug.

When a manufacturing method according to an exemplary embodiment is applied to a process of forming memory cells of a DRAM, it is possible to easily form a highly-integrated DRAM.

It is apparent that the present invention is not limited to the above exemplary embodiments, but may be modified and changed without departing from the scope and spirit of the invention.

What is claimed is:

1. A method of manufacturing a semiconductor device, comprising:
    forming a first interconnect trench and a second interconnect trench adjacent to the first interconnect trench in an interlayer insulating film;
    providing a first interconnect and a space on the first interconnect within said first interconnect trench, and a second interconnect and a space on the second interconnect within said second interconnect trench;
    forming a first trench resulting from said first interconnect trench being increased in width and a second trench resulting from said second interconnect trench being increased in width, by carrying out isotropic etching, to expose a respective protrusion portion of each of the first interconnect in the first trench and the second interconnect in the second trench; and
    forming a first insulating film within said first trench and a second insulating film within said second trench by filling an insulating material in said first trench and said second trench.

2. The method of manufacturing a semiconductor device according to claim 1, further comprising:
    forming a hole passing through between said first interconnect and said second interconnect and penetrating said interlayer insulating film self-alignedly with said first insulating film and said second insulating film, by carrying out anisotropic etching utilizing said first and second insulating films as masks; and
    forming a plug by filling a conductive material in said hole.

3. The method of manufacturing a semiconductor device according to claim 1, wherein said interlayer insulating film is a silicon oxide film, and said first insulating film and said second insulating film are silicon nitride films.

4. The method of manufacturing a semiconductor device according to claim 1, wherein a thickness of the interlayer insulating film is 1.2 times or larger and 5 times or less than the thickness of the first and second interconnect.

5. The method of manufacturing a semiconductor device according to claim 4, wherein a thickness of the interlayer insulating film is 1.8 times or larger and 2.5 times or less than the thickness of the first and second interconnect.

6. The method of manufacturing a semiconductor device according to claim 2, wherein said semiconductor device comprises:
    a memory cell array in which memory cells are matrix-arranged, each of the memory cells comprising a transistor and a storage element;
    word lines constituting gates of the transistors; and
    bit lines intersecting with the word lines and connected to drains of the transistors; and
    said first interconnect and said second interconnect are formed as the bit lines.

7. The method of manufacturing a semiconductor device according to claim 6, wherein said bit lines include a laminated film made of a tungsten nitride and a tungsten.

8. The method of manufacturing a semiconductor device according to claim 6, wherein a lower end of said plug is connected to a contact plug in contact with a semiconductor substrate, and an upper end of said plug is connected to one of the storage elements.

9. The method of manufacturing a semiconductor device according to claim 2, wherein said semiconductor device comprises:
 a memory cell array in which memory cells are matrix-arranged, each of the memory cells comprising a transistor and a capacitor;
 word lines constituting gates of the transistors; and
 bit lines intersecting with the word lines and connected to drains of the transistors; and
 said first interconnect and said second interconnect are formed as the word lines.

10. The method of manufacturing a semiconductor device according to claim 9, said first interconnect and said second interconnect are formed in a semiconductor substrate.

11. The method of manufacturing a semiconductor device according to claim 9, wherein said plug is formed as a contact plug in contact with a semiconductor substrate.

12. A method of manufacturing a semiconductor device, comprising:
 forming a first interconnect trench and a second interconnect trench adjacent to the first interconnect trench in an interlayer insulating film;
 forming a first conductive film on said interlayer insulating film such that said first interconnect trench and said second interconnect trench are filled with the first conductive film;
 removing a portion of said first conductive film external to said first interconnect trench and said second interconnect trench, an upper portion of said first conductive film within said first interconnect trench, and an upper portion of said first conductive film within said second interconnect trench, thereby forming a first interconnect and a space on the first interconnect within said first interconnect trench, and a second interconnect and a space on the second interconnect within said second interconnect trench;
 forming a first mask trench resulting from said first interconnect trench being increased in width and a second mask trench resulting from said second interconnect trench being increased in width, by carrying out isotropic etching;
 forming a masking insulating film on said interlayer insulating film such that said first mask trench and said second mask trench are filled with the masking insulating film;
 removing a portion of said masking insulating film external to said first mask trench and said second mask trench, thereby forming a first mask insulating film within said first mask trench and a second mask insulating film within said second mask trench;
 forming a hole passing through between said first interconnect and said second interconnect and penetrating said interlayer insulating film self-alignedly with said first mask insulating film and said second mask insulating film, by carrying out anisotropic etching utilizing said first and second mask insulating films as masks;
 forming a second conductive film such that said hole is filled with the second conductive film; and
 removing a portion of said second conductive film external to said hole, thereby forming a plug within said hole.

13. The method of manufacturing a semiconductor device according to claim 12, wherein said interlayer insulating film is a silicon oxide film, and said first mask insulating film and said second mask insulating film are silicon nitride films.

14. The method of manufacturing a semiconductor device according to claim 12, wherein said semiconductor device comprises:
 a memory cell array in which memory cells are matrix-arranged, each of the memory cell comprising a transistor and a storage element;
 word lines constituting gates of the transistors; and
 bit lines intersecting with the word lines and connected to drains of the transistors; and
 said first interconnect and said second interconnect are formed as the bit lines.

15. The method of manufacturing a semiconductor device according to claim 14, wherein a lower end of said plug is connected to a contact plug in contact with a semiconductor substrate, and an upper end of said plug is connected to one of the storage elements.

16. The method of manufacturing a semiconductor device according to claim 12, wherein said semiconductor device comprises:
 a memory cell array in which memory cells are matrix-arranged, each of the memory cells comprising a transistor and a capacitor;
 word lines constituting gates of the transistors; and
 bit lines intersecting with the word lines and connected to drains of the transistors; and
 said first interconnect and said second interconnect are formed as the word lines.

17. The method of manufacturing a semiconductor device according to claim 16, wherein said plug is formed as a contact plug in contact with a semiconductor substrate.

18. A method of manufacturing a semiconductor device, comprising:
 forming an interlayer insulating film on a substrate;
 forming a first interconnect trench and a second interconnect trench adjacent to the first interconnect trench in the interlayer insulating film;
 filling a first conductive film in the first interconnect trench and the second interconnect trench;
 removing an upper portion of the first conductive film in the first interconnect trench and the second interconnect trench;
 forming a first mask trench and a second mask trench by removing the upper portion of the interlayer insulation film over the first conductive film, wherein both width of the first mask trench and the second mask trench are larger than a width of the first conductive film;
 filling a masking insulating film in the first mask trench and the second mask trench;
 forming a hole between the first interconnect trench and the second interconnect trench by using the masking insulating film as an etching mask; and
 forming a plug by filling the hole with a second conductive film.

19. The method of manufacturing a semiconductor device according to claim 18, wherein forming a first mask trench and a second mask trench is performed by wet etching.

20. The method of manufacturing a semiconductor device according to claim 18, wherein said interlayer insulating film is a silicon oxide film, and said masking insulating film is a silicon nitride film.

* * * * *